United States Patent
Nam et al.

(10) Patent No.: US 8,305,129 B2
(45) Date of Patent: Nov. 6, 2012

(54) INTERNAL CLOCK GENERATING CIRCUIT AND METHOD FOR GENERATING INTERNAL CLOCK SIGNAL WITH DATA SIGNAL

(75) Inventors: Jang Jin Nam, Yongin-si (KR); Yong Weon Jeon, Seongnam-si (KR)

(73) Assignee: TLI Inc., Seongnam-Si (KR)

( * ) Notice: Subject to any disclaimer, the term of this patent is extended or adjusted under 35 U.S.C. 154(b) by 105 days.

(21) Appl. No.: 12/947,458

(22) Filed: Nov. 16, 2010

(65) Prior Publication Data

US 2011/0199143 A1 Aug. 18, 2011

(30) Foreign Application Priority Data

Feb. 18, 2010 (KR) .................. 10-2010-0014608

(51) Int. Cl.
*G06F 1/04* (2006.01)
*H03K 3/00* (2006.01)
(52) U.S. Cl. .............. 327/299; 327/164; 327/291
(58) Field of Classification Search ............ 327/164, 327/291, 299
See application file for complete search history.

(56) References Cited

U.S. PATENT DOCUMENTS 6,404,840 B1 * 6/2002 Sindalovsky .............. 377/48

FOREIGN PATENT DOCUMENTS

KR 10-2005-0077833 A 8/2005
KR 100868299 B1 11/2008

* cited by examiner

*Primary Examiner* — John Poos
(74) *Attorney, Agent, or Firm* — Kile Park Goekjian Reed & McManus PLLC

(57) ABSTRACT

An internal clock generating circuit and a method for generating an internal clock signal are disclosed. The internal clock generating circuit includes a transition detecting block for detecting transitions in a data signal and generating data transition information, and an internal clock generating block for generating and storing a period digital data while detecting the unit period of the data signal in a period confirming mode. In the internal clock generating circuit, the internal clock signal can be generated without the external clock signal, so that the internal clock generating circuit can be implemented with a simple constitution. Additionally, an extra locking time is not required for locking the extra clock signal, so that the operating speed of the internal clock generating circuit is improved. The internal clock signal is dependent on the data signal, so that it is easy to control the set-up and hold for data.

8 Claims, 11 Drawing Sheets

INTERNAL CLOCK GENERATING CIRCUIT AND METHOD FOR GENERATING INTERNAL CLOCK SIGNAL WITH DATA SIGNAL

CROSS-REFERENCE TO RELATED APPLICATION

This application claims the benefit of Korean Patent Application No. 10-2010-0014608, filed on Feb. 18, 2010, the contents of which are hereby incorporated herein by reference in their entirety.

BACKGROUND

1. Field

The present invention relates to a clock generating circuit and method, and more particularly, to an internal clock generating circuit and method to generate an internal clock signal with a data signal.

2. Description of the Related Art

Most semiconductor chips include an internal clock to generate an internal clock signal. The internal clock signal is used as a reference signal for controlling various internal signals in appropriate timing, so that the data, which is externally supplied, can be processed in appropriate ways.

Most of conventional internal clock generating circuits include a phase-locked loop (PLL) or a delay-locked loop (DLL) to generate the internal clock signal. The conventional internal clock generating circuits receive an external clock signal. And, the external clock signal is locked with the PLL or the DLL to generate the internal clock signal.

However, in the conventional internal clock generating circuits, an extra signal line is required for receiving the external clock signal. The extra signal line causes the constitution of the internal clock generating circuit to be more complicated. And, in the conventional internal clock generating circuits, an extra locking time is required for locking the extra clock signal. The extra locking time causes the operating speed of the internal clock generating circuit to be declined.

SUMMARY OF THE INVENTION

The present invention is directed to an internal clock generating circuit and method to generate an internal clock signal with a data signal without using the external clock signal.

According to an aspect of the present invention, there is provided a transition detecting block for detecting transitions in a data signal to generate a data transition information signal; and an internal clock generating block for generating and storing a period digital data signal when detecting the unit period of the data signal in a period confirming mode, and generating an internal clock signal based on the data transition information signal in an internal clock generating mode, wherein the internal clock signal repeatedly transitions between HIGH and LOW voltage levels every time a waiting time is passed following a transition in the data signal, and wherein the waiting time is dependent on the period digital data.

According to the internal clock generating circuit of the present invention, the internal clock signal can be generated without the external clock signal, so that the internal clock generating circuit can be implemented with a simple circuit structure. And, an extra locking time is not required for locking the extra clock signal, so that the operating speed of the internal clock generating circuit is improved. Also, the internal clock signal is generated based on the data signal, so that it is easy to control the set-up and hold for data.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain aspects of the invention.

DETAILED DESCRIPTION OF EMBODIMENTS

The foregoing and other objects, features, and advantages of the invention are apparent from the following detailed description taken in conjunction with the accompanying drawings The internal clock generating circuit of the present invention generates an internal clock signal using a data signal. And, the logic state of the data signal at the current unit period can be same as or different from the previous unit period.

Figure 1:
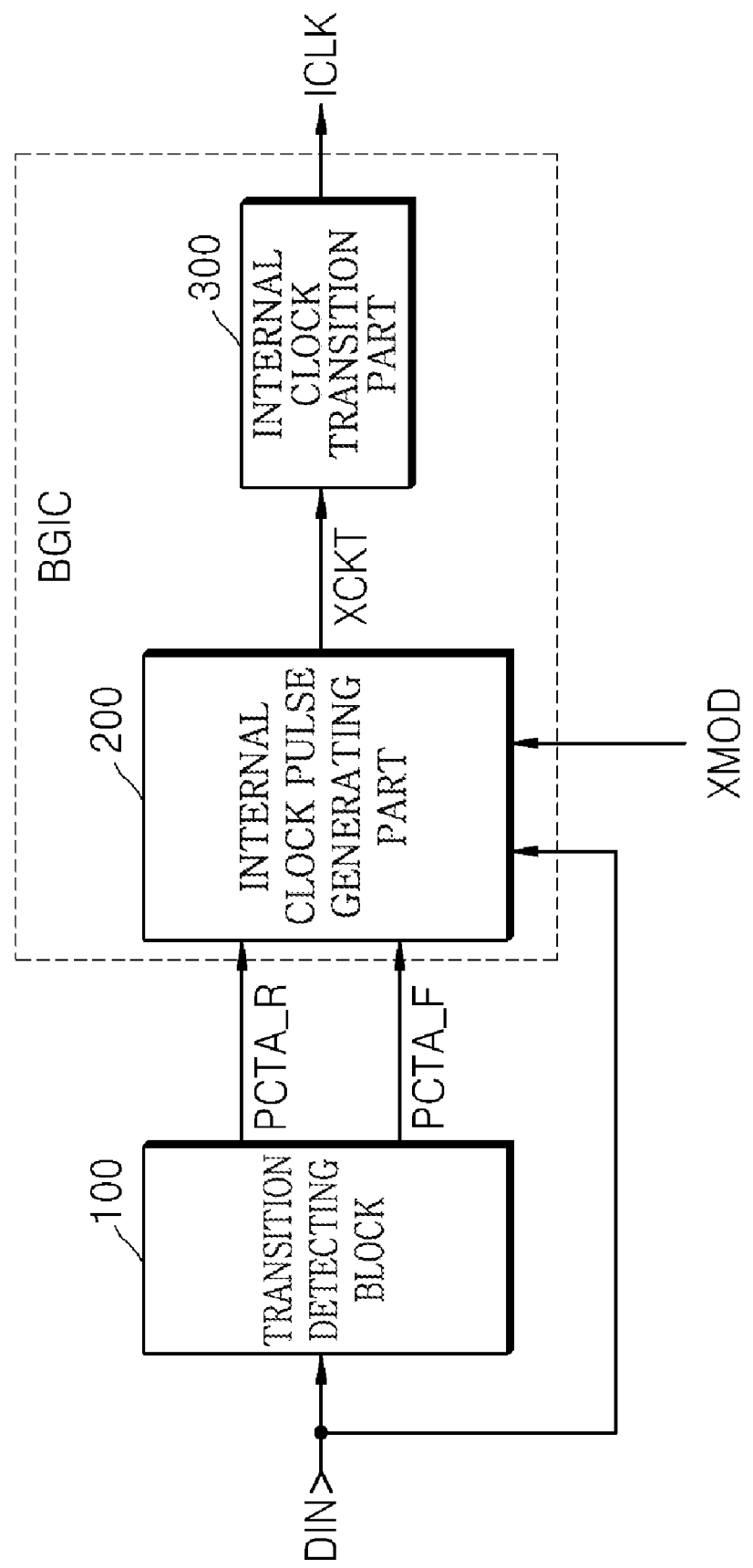
FIG. 1 is a drawing of an internal clock generating circuit according to an embodiment of the present invention.

Referring to FIG. 1, the internal clock generating circuit of the present invention includes a transition detecting block 100 and an internal clock generating block BGIC. The transition detecting block 100 detects transitions in an input data signal DIN, and generates 'data transition information' in the form of one or more data transition information signals indicative of the timing of transitions in the data signal. In this embodiment, a rising transition confirmation signal PCTA_R and a falling transition confirmation signal PCTA_F are data transition information signals carrying the 'data transition information'.

Figure 2:
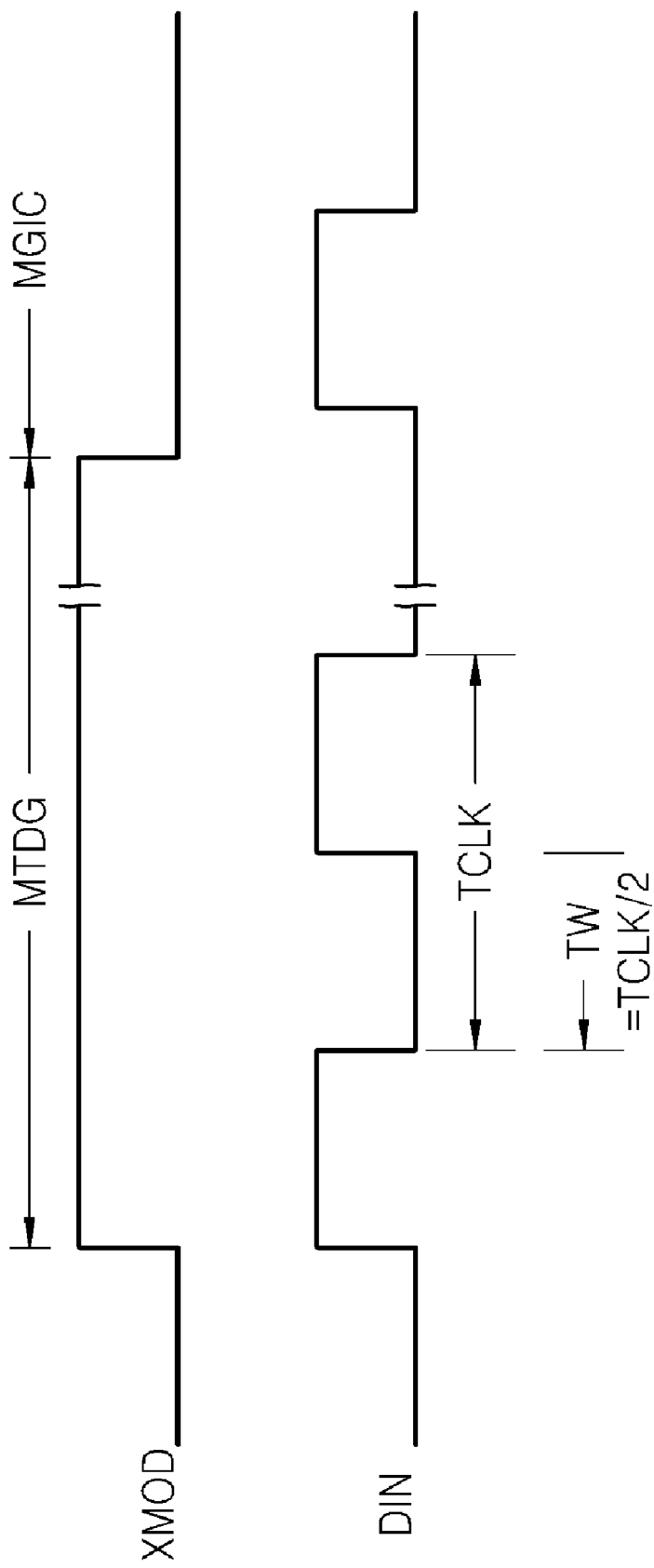
FIG. 2 is a timing diagram for explaining operation modes of the internal clock generating circuit of the present invention.

The internal clock generating block BGIC alternately operates in a period confirming mode MTDG or an internal clock generating mode MGIC (shown in FIG. 2). The internal clock generating block detects the unit period TCLK (shown in FIG. 2) of the data signal DIN, and generates a period digital data TDIG signal (shown in FIGS. 8 and 9) when operating in the period confirming mode MTDG (shown in FIG. 2). In the period confirming mode MTDG, a mode signal XMOD is in the logic state HIGH or "H".

The internal clock generating block BGIC generates an internal clock signal ICLK, which is generated in response to the 'data transition information' when operating in the internal clock generating mode MGIC (shown in FIG. 2). The internal clock signal ICLK transitions between LOW and HIGH voltage levels every time a waiting time TW (shown in FIG. 2) has elapsed following a transition of the data signal DIN. Here, the waiting time TW is dependent on the period digital data TDIG. Preferably, the waiting time TW is equal to or approximately equal to half of the unit period TCLK of the data signal DIN. The waiting time may be predetermined, or variable and depending on the period digital data signal TDIG.

Figure 3:
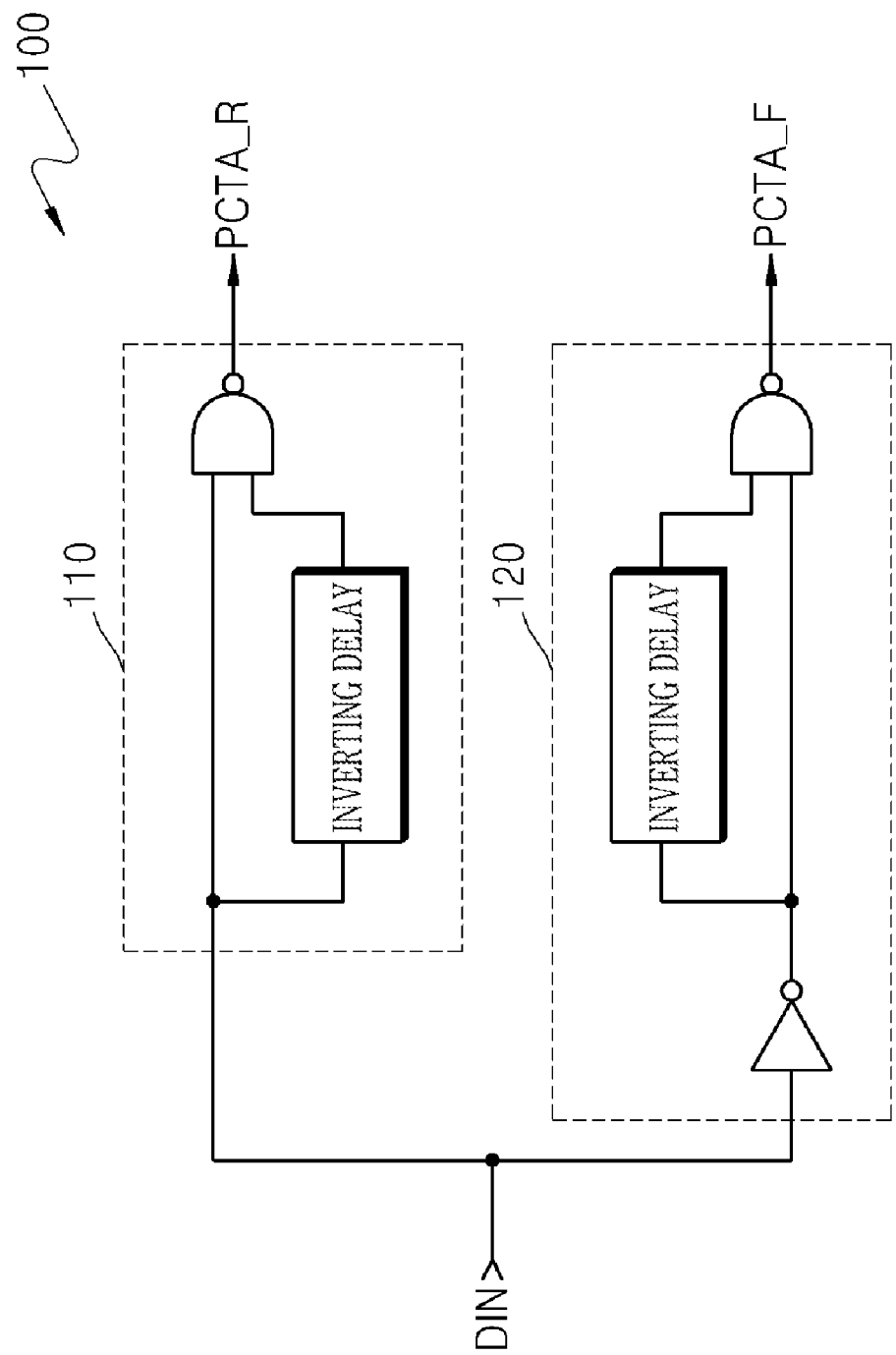
FIG. 3 is a diagram illustrating the transition detecting block of FIG. 1 in detail.

FIG. 3 is a diagram illustrating the transition detecting block 100 of FIG. 1 in detail. Referring to FIG. 3, the transition detecting block 100 includes a rising transition confirmation portion 110 and a falling transition confirmation portion 120.

The rising transition confirmation portion 110 generates a rising transition confirmation signal PCTA_R at its output in response to detecting a rising transition in the data signal DIN. That is to say, the rising transition confirmation portion 110 generates a logic LOW pulse or "L" pulse in the PCTA_R signal (i.e., the PCTA_R signal transitions from a HIGH voltage level to a LOW voltage level for a limited period of time equal to the width of the "L" pulse) when the data signal DIN transitions from a logic "L" state to a logic HIGH or "H" state (Refer to t11 in FIG. 10A). The rising transition confirmation portion 110 receives at its input the data signal DIN, the DIN signal being provided at a first input of a NAND gate and at an input to an inverting delay. The output of the inverting delay is provided to the second input node of the NAND gate, and the PCTA_R signal is generated at the output of the NAND gate.

The falling transition confirmation portion 120 generates a falling transition confirmation signal PCTA_F in response to detecting a falling transition in the data signal DIN. That is to say, the falling transition confirmation portion 120 generates a "L" pulse in the PCTA_F signal when the data signal DIN transitions from a logic "H" state to a logic "L" state. (Refer to t12 in FIG. 10A). The falling transition confirmation portion 120 receives at its input the data signal DIN, inverts the DIN signal, and provides the inverted DIN signal to a first input of a NAND gate and to an input of an inverting delay. The output of the inverting delay is provided to the second input node of the NAND gate, and the PCTA_F signal is generated at the output of the NAND gate.

Referring again to FIG. 1, the internal clock generating block BGIC includes an internal clock pulse generating part 200 and an internal clock transition part 300. The internal clock pulse generating part 200 generates the period digital data TDIG signal when operating in the period confirming mode MTDG. The internal clock pulse generating part 200 generates a clock transition signal XCKT according to the 'data transition information' received from the transition detecting block 100 when the BGIC operates in the internal clock generating mode MGIC. The clock transition signal XCKT undergoes a "L" pulse every time the waiting time TW has elapsed following a transition of the data signal DIN.

Figure 4:
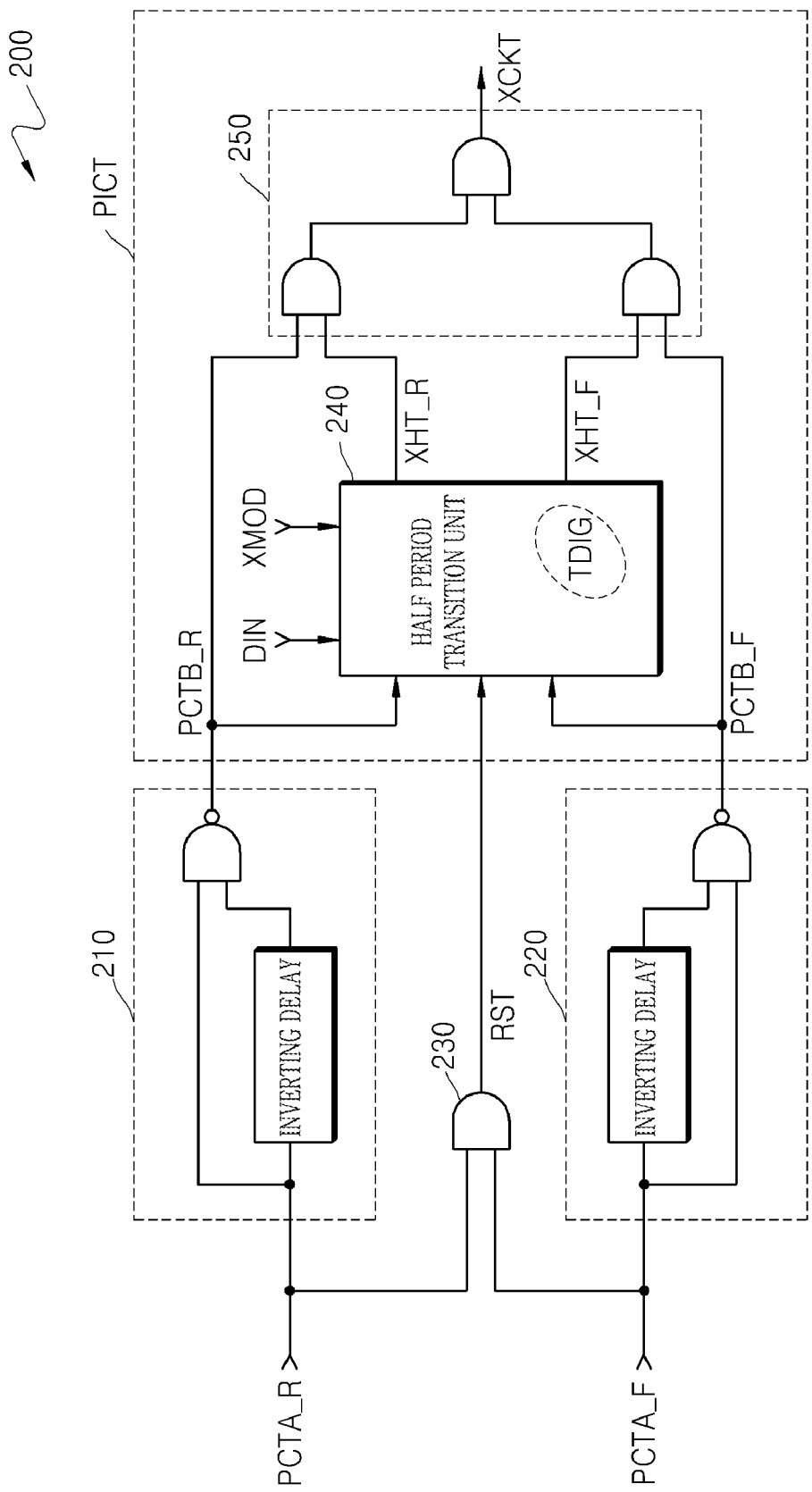
FIG. 4 is a diagram illustrating the internal clock pulse generating part of FIG. 1.

FIG. 4 is a diagram illustrating the internal clock pulse generating part 200 of FIG. 1 in detail. Referring to FIG. 4, the internal clock pulse generating part 200 includes a rising transition responding portion 210, a falling transition responding portion 220, a combining transition responding portion 230 and an internal clock transition portion PICT.

The rising transition responding portion 210 generates a rising transition responding signal PCTB_R in response to the rising transition confirmation signal PCTA_R. The rising transition responding portion 210 generates a "L" pulse in the PCTB_R signal in response to each rising-edge transition in the PCTA_R signal, the rising-edge transitions in the PCTA_R signal corresponding to the lagging edges of the "L" pulses in the rising transition confirmation signal PCTA_R generated by the rising transition confirmation portion 110 (Refer to t21 in FIG. 10A).

The falling transition responding portion 220 generates a falling transition responding signal PCTB_F in response to the falling transition confirmation signal PCTA_F. The falling transition responding portion 220 generates a "L" pulse in the PCTB_F signal in response to each rising-edge transition in the PCTA_F signal, the rising-edge transitions in the PCTA_F signal corresponding to the lagging edges of the "L" pulses in the falling transition confirmation signal PCTA_F generated by the falling transition confirmation portion 120 (Refer to t22 in FIG. 10A).

The rising and falling transition responding portions 210 and 220 are each formed of an inverting delay and a NAND gate. The input of each of the portions is provided to a first input of the NAND gate and to the input of the inverting delay, the output of the inverting delay being provided to the second input of the NAND gate. The circuits respectively receive at their inputs the PCTA_R and PCTA_F signals, and produce the PCTB_R and PCTB_F output signals at the output of their respective NAND gates.

The combining transition responding portion 230 generates a reset signal RST responding to the rising transition responding signal PCTA_R and the falling transition responding signal PCTA_F. The combining transition responding portion 230 is formed of an AND gate receiving at its inputs the PCTA_R and PCTA_F signals, and generates at its output the reset signal RST. The reset signal RST undergoes a "L" pulse in response to each leading edge of the pulses in the rising transition responding signal PCTA_R and the falling transition responding signal PCTA_F (Refer to t23 and t24 in FIG. 10A).

The internal clock transition portion PICT generates the period digital data TDIG signal when operating in the period confirming mode MTDG. The internal clock transition portion PICT generates the clock transition signal XCKT in response to the rising transition responding signal PCTB_R and the falling transition responding signal PCTB_F when operating in the internal clock generating mode MGIC. The clock transition signal XCKT undergoes a "L" pulse in response to the rising transition responding signal PCTB_R and the falling transition responding signal PCTB_F. Here, the clock transition signal XCKT undergoes a "L" pulse every time the waiting time TW has elapsed following a transition of the data signal DIN. The generation of the pulse in the clock transition signal XCKT is stopped in response to the reset signal RST (i.e., the XCKT is held HIGH when the RST signal is LOW).

The internal clock transition portion PICT includes a half period transition unit 240 and a clock transition generating unit 250.

The half period transition unit 240 generates the period digital data TDIG signal when operating in the period confirming mode MTDG. And, the half period transition unit 240 generates a rising half period signal XHT_R and a falling half period signal XHT_F when operating in the internal clock generating mode MGIC. The rising half period signal XHT_R undergoes a "L" pulse delayed by the waiting time TW following rising transitions in the responding signal PCTB_R (Refer to t31 in FIG. 10A). The rising half period signal XHT_R further undergoes a "L" pulse delayed by the waiting time TW following the generation of a "L" pulse in the falling half period signal XHT_F. However, the generation of the "L" pulse in the rising half period signal XHT_R is stopped when a pulse in the reset signal RST occurs during the waiting time TW (Refer to t32 in FIG. 10A).

Figure 10A:
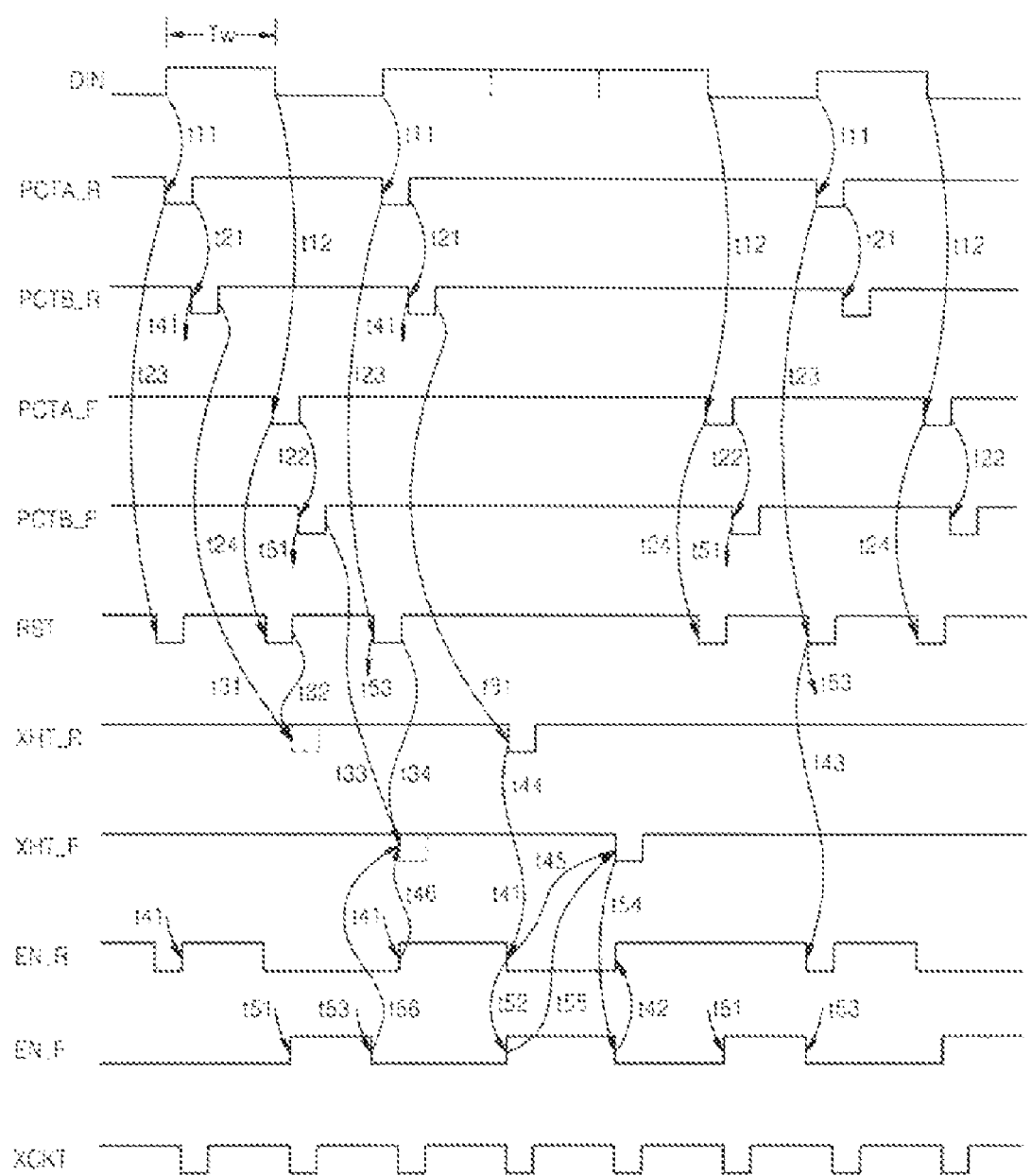
FIG. 10A and FIG. 10B are timing diagrams for the operation of the internal clock generating circuit of the present invention.

The falling half period signal XHT_F undergoes a "L" pulse delayed by the waiting time TW following falling transitions in the responding signal PCTB_F (Refer to t33 in FIG. 10A). The falling half period signal XHT_F further undergoes a "L" pulse delayed by the waiting time TW following the generation of a "L" pulse in the rising half period signal XHT_R. However, the generation of the "L" pulse in the falling half period signal XHT_F is stopped when a pulse in the reset signal RST occurs during the waiting time TW (Refer to t32 in FIG. 10A).

Figure 5:
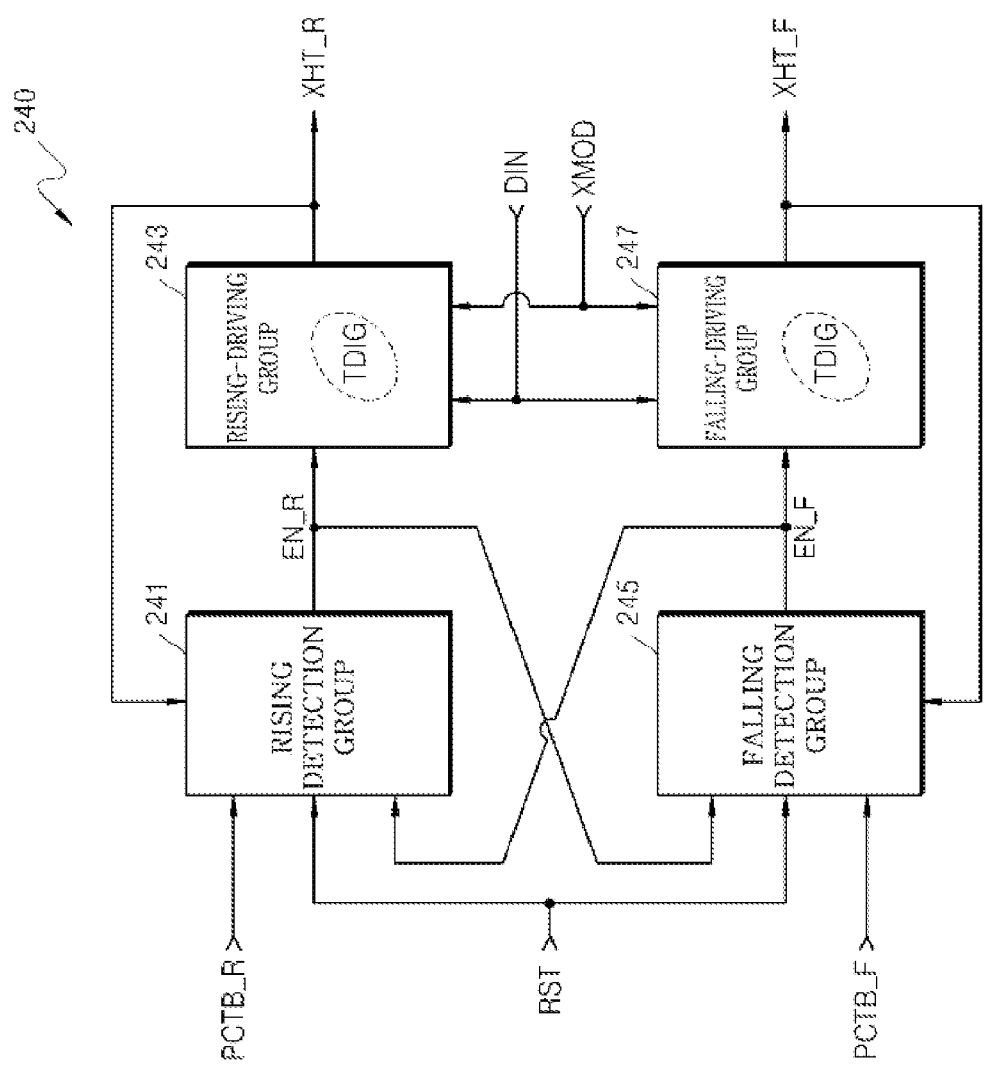
FIG. 5 is a diagram illustrating the half period transition unit of FIG. 4 in detail.

FIG. 5 is a diagram illustrating the half period transition unit 240 of FIG. 4 in detail. Referring to FIG. 5, the half period transition unit 240 includes a rising detection group 241, a rising-driving group 243, a falling detection group 245, and a falling-driving group 247.

The rising detection group 241 receives the rising transition responding signal PCTB_R, the rising half period signal XHT_R, the reset signal RST, and a falling transition driving signal EN_F, and generates a rising transition driving signal EN_R. The falling transition driving signal EN_F is generated at an output of the falling detection group 245. The rising transition driving signal EN_R is activated to "H" when a pulse occurs in the rising transition responding signal PCTB_R or the deactivation of a pulse occurs in the falling transition driving signal EN_F during activation (i.e., a HIGH or "H" voltage level) of the reset signal RST (Refer to t41 and t42 in FIG. 10A). Also, the rising transition driving signal EN_R is deactivated to "L" when a "L" pulse in the reset signal RST or in the rising half period signal XHT_R is generated. (Refer to t43 and t44 in FIG. 10A)

The rising-driving group 243 receives the rising transition driving signal EN_R, and generates the rising half period signal XHT_R. The rising half period signal XHT_R undergoes a "L" pulse delayed by the waiting time TW when the rising transition driving signal EN_R is deactivated to "L" (Refer to t45 in FIG. 10A). However, when the rising transition driving signal EN_R is deactivated to "L" during the waiting time TW following the activation of the rising transition driving signal EN_R, the generation of the pulse in the falling half period signal XHT_F is interrupted (Refer to t46 in FIG. 10A).

The falling detection group 245 receives the falling transition responding signal PCTB_F, the falling half period signal XHT_F, the reset signal RST, and the rising transition driving signal EN_R, and generates the falling transition driving signal EN_F. The falling transition driving signal EN_F is activated to "H" when a pulse occurs in the falling transition responding signal PCTB_F or the deactivation of a pulse occurs in the rising transition driving signal EN_R during activation of the reset signal RST (Refer to t51 and t52 in FIG. 10A). Also, the falling transition driving signal EN_F is deactivated to "L" when a "L" pulse in the reset signal RST or in the falling half period signal XHT_F is generated. (Refer to t53 and t54 in FIG. 10A)

The falling-driving group 247 receives the falling transition driving signal EN_F, and generates the falling half period signal XHT_F. The falling half period signal XHT_F undergoes a "L" pulse delayed by the waiting time TW when the falling transition driving signal EN_F is activated to "H" (Refer to t55 in FIG. 10A). However, when the falling transition driving signal EN_F is deactivated to "L" during the waiting time TW following the activation of the falling transition driving signal EN_F, the generation of the pulse in the falling half period signal XHT_F is interrupted (Refer to t56 in FIG. 10A).

Figure 6:
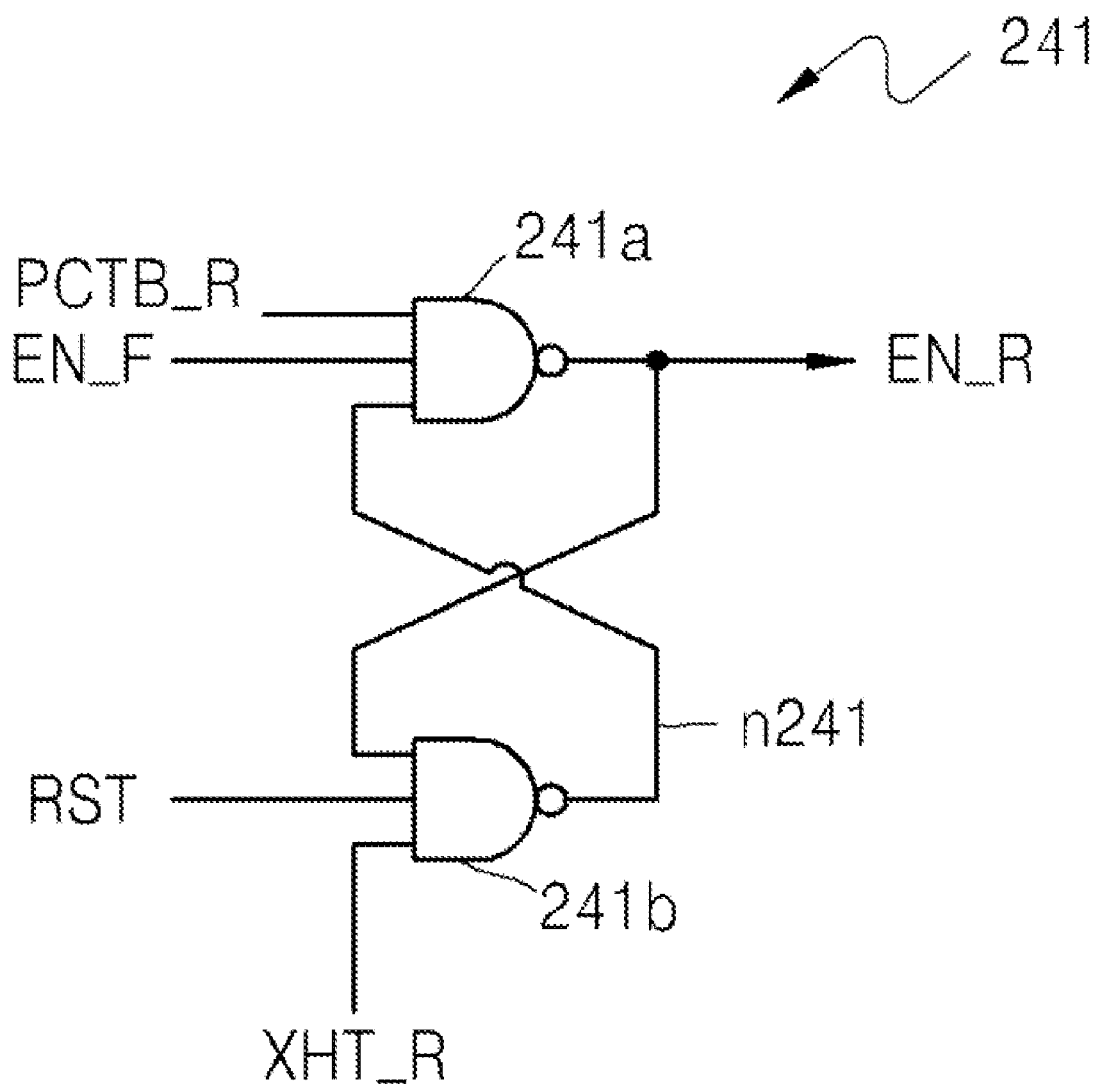
FIG. 6 is a diagram illustrating the rising detection group of FIG. 5 in detail.

FIG. 6 is a diagram illustrating the rising detection group 241 of FIG. 5 in detail. Referring to FIG. 6, the rising detection group 241 includes a first rising logic NAND gate 241a and a second rising logic NAND gate 241b.

The first rising logic NAND gate 241a receives the rising transition responding signal PCTB_R, the falling transition driving signal EN_F and a rising out signal n241, and generates the rising transition driving signal EN_R at its output. The rising out signal n241 is generated from the second rising logic NAND gate 241b. The rising transition driving signal EN_R is activated to "H" when a "L" pulse occurs in the rising transition responding signal PCTB_R or in the falling transition driving signal EN_F. The rising transition driving signal EN_R is deactivated to "L" in response to the activation to "H" of the rising out signal n241.

The second rising logic NAND gate 241b receives the reset signal RST, the rising half period signal XHT_R and the rising transition driving signal EN_R at its inputs, and generates the rising out signal n241 at its output. The rising out signal n241 is activated to "H" when a "L" pulse occurs in the reset signal RST or in the rising half period signal XHT_R. The rising out signal n241 is deactivated to "L" in response to the activation to "H" of the rising transition driving signal EN_R.

Figure 7:
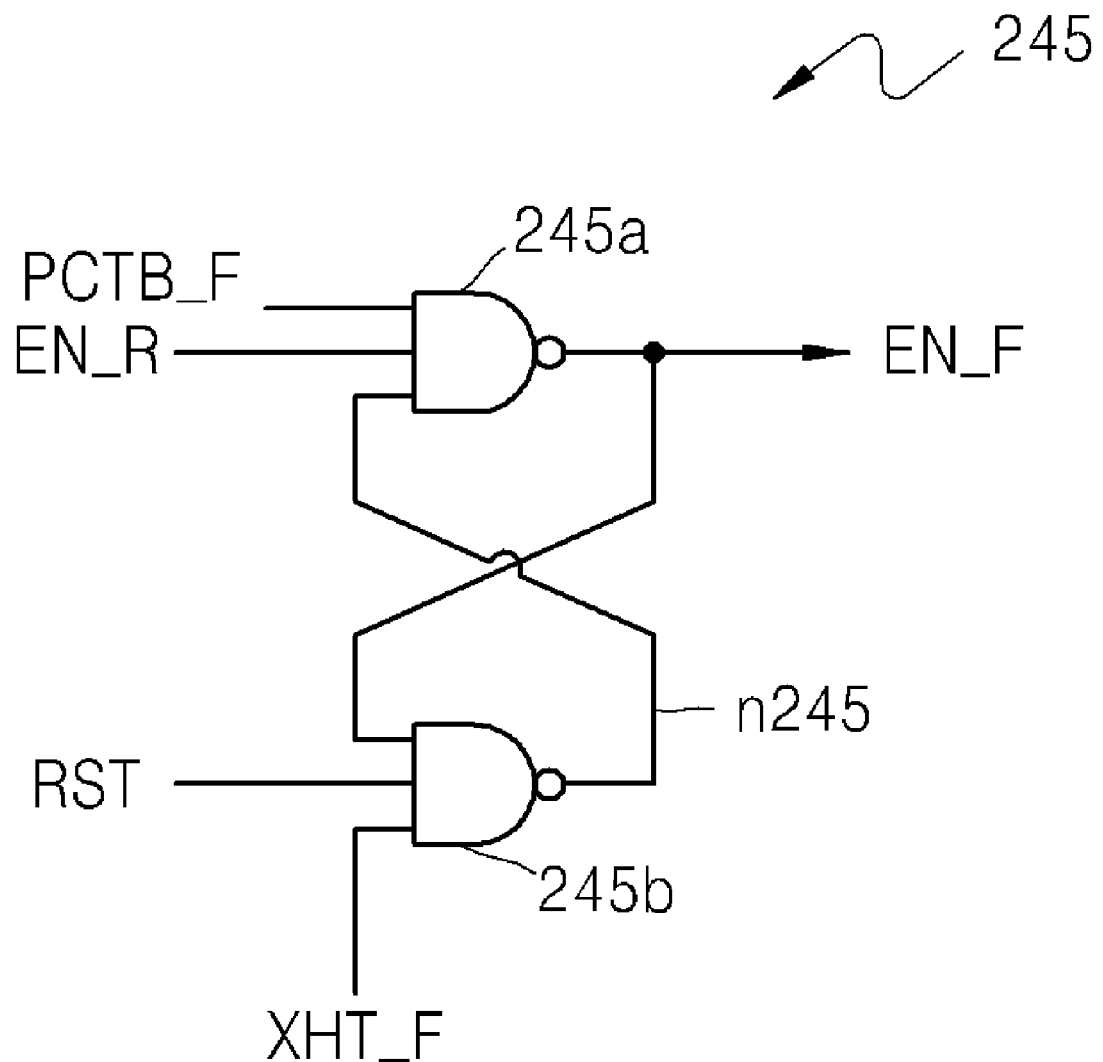
FIG. 7 is a diagram illustrating the falling detection group of FIG. 5 in detail.

FIG. 7 is a diagram illustrating the falling detection group 245 of FIG. 5 in detail. Referring to FIG. 7, the falling detection group 245 includes a first falling logic NAND gate 245a and a second falling logic NAND gate 245b.

The first falling logic NAND gate 245a receives the falling transition responding signal PCTB_F, the rising transition driving signal EN_R and a falling out signal n245 at its inputs, and generates the falling transition driving signal EN_F at its output. The falling out signal n245 is generated from the second falling logic NAND gate 245b. The falling transition driving signal EN_F is activated to "H" when a "L" pulse occurs in the falling transition responding signal PCTB_F or in the rising transition driving signal EN_R. The falling transition driving signal EN_F is deactivated to "L" in response to the activation to "H" of the falling out signal n245.

The second falling logic NAND gate 245b receives the reset signal RST, the falling half period signal XHT_F and the falling transition driving signal EN_F at its inputs, and generates the falling out signal n245 at its output. The falling out signal n245 is activated to "H" when a "L" pulse occurs in the reset signal RST or in the falling half period signal XHT_F. The falling out signal n245 is deactivated to "L" in response to the activation to "H" of the falling transition driving signal EN_F.

Figure 8:
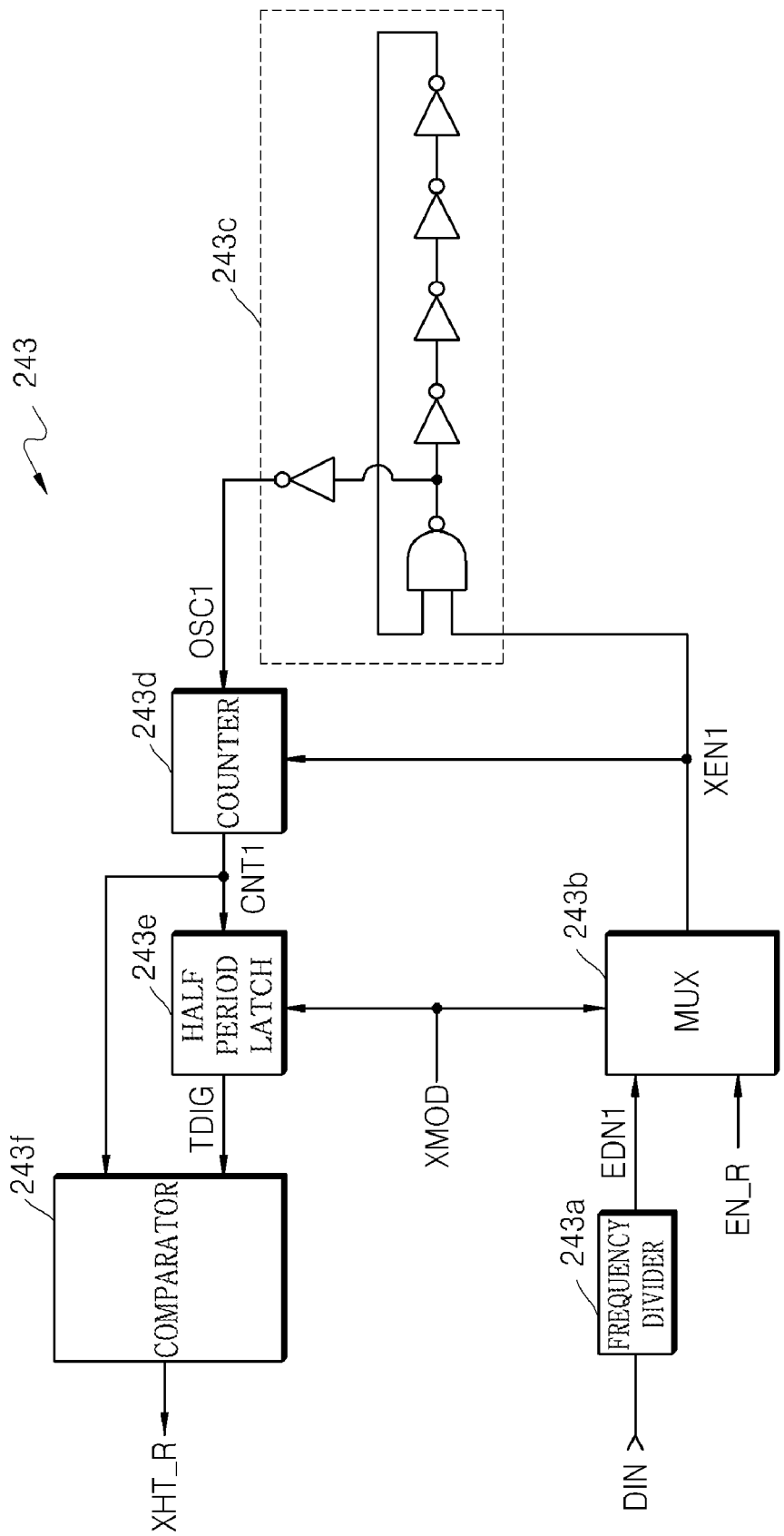
FIG. 8 is a diagram illustrating the rising-driving group of FIG. 5 in detail.

FIG. 8 is a diagram illustrating the rising-driving group 243 of FIG. 5 in detail. Referring to FIG. 8, the rising-driving group 243 includes a frequency divider 243a, a multiplexer 243b, an oscillator 243c, a counter 243d, a half period latch 243e, and a comparator 243f.

The frequency divider 243a divides the frequency of the data signal DIN to generate a period extension signal EDN1. In this embodiment, the frequency of the period extension signal EDN1 is half that of the data signal DIN. That is to say, the unit period of the period extension signal EDN1 is twice as that of the data signal DIN.

The multiplexer 243b selects one of the period extension signal EDN1 and the rising transition driving signal EN_R according to the mode signal XMOD. The selected one of the period extension signal EDN1 and the rising transition driving signal EN_R is output from the multiplexer as an enable signal XEN1. In this embodiment, the period extension signal EDN1 is selected when operating in the period confirming mode MTDG. The rising transition driving signal EN_R is selected when operating in the internal clock generating mode MGIC.

The oscillator 243c is enabled in response to the enable signal XEN1. In this embodiment, the oscillator 243c is enabled when the enable signal XEN1 is in a logic "H" or HIGH state. The oscillator 243c generates an oscillation signal OSC1 when it is enabled.

The counter 243d is reset in response to the transition to "H" (i.e., a rising transition) in the enable signal XEN1. The counter 243d counts the number of rising transitions to "H" in the oscillation signal OSC1 to generate a counting data signal CNT1.

The half period latch 243e is reset in response to the rising transition to "H" in the mode signal XMOD. The half period latch 243e divides the counting data CNT1 into halves to generate the period digital data TDIG. For example, if the counting data CNT1 is equal to 8, then the half period digital latch outputs a data signal TDIG signal equal to 4. Here, the remaining data can be ignored.

Accordingly, the period digital data TDIG has the same period as the data signal DIN. In particular, in one embodiment, the period digital data TDIG has digital data corresponding to a period of the data signal DIN, such that TDIG is determined as the digital data having the information of the period of the data signal DIN. In another embodiment, the delays in oscillator 243c may be selected so as to ensure that TDIG has the same period as the data signal DIN. In the internal clock generating mode MGIC, the comparator 243f compares the counting data CNT1 with the period digital data TDIG to generate a rising half period signal XHT_R. The rising half period signal XHT_R undergoes a "L" pulse when the counting data CNT1 is equal to the period digital data TDIG.

As a result, the rising half period signal XHT_R undergoes a "L" pulse when the half period of the data signal DIN is passed following a lagging edge of the rising transition driving signal EN_R.

Figure 9:
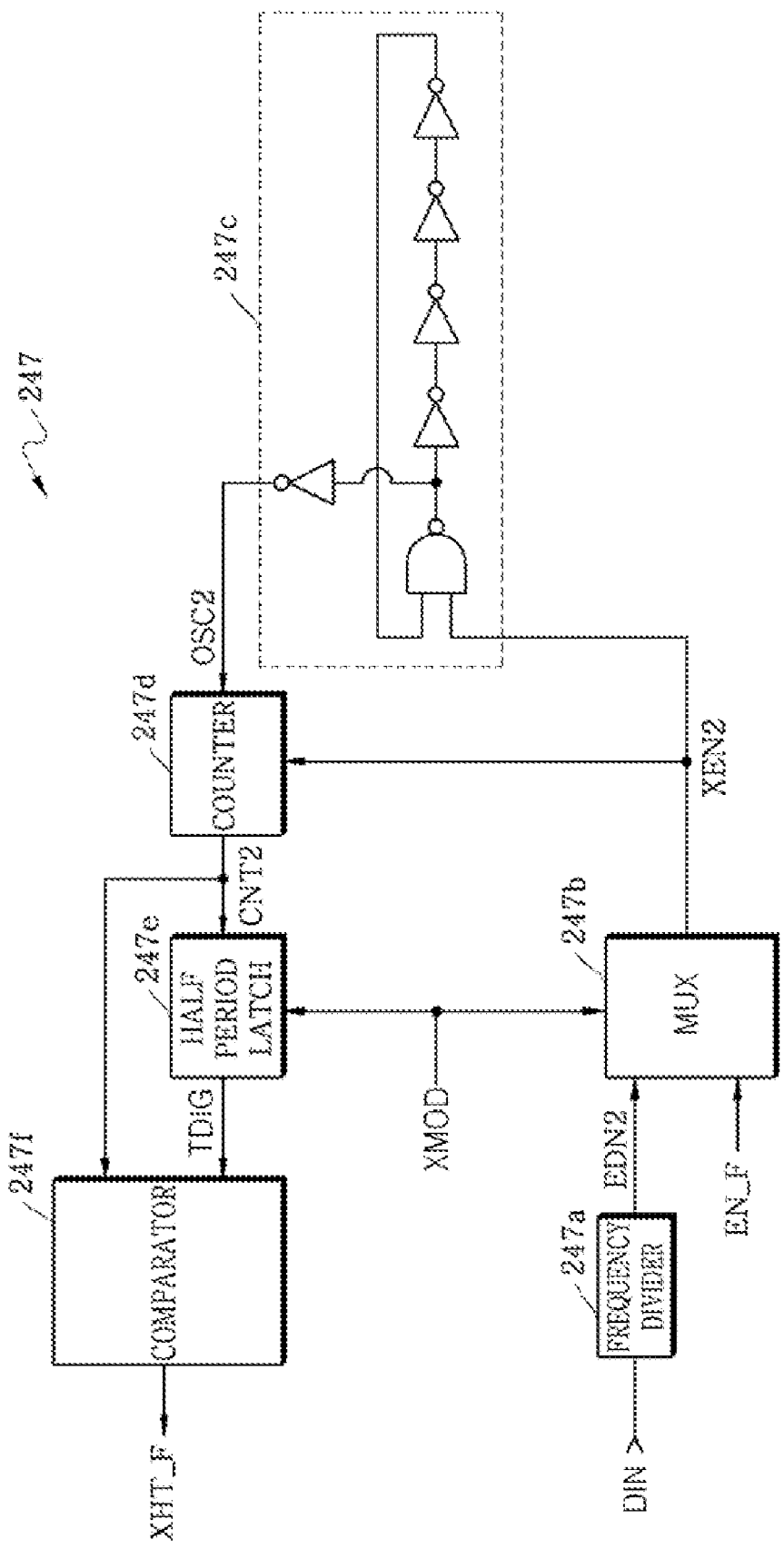
FIG. 9 is a diagram illustrating the falling-driving group of FIG. 5 in detail.

FIG. 9 is a diagram illustrating the falling-driving group 247 of FIG. 5 in detail. Referring to FIG. 9, the falling-driving group 247 includes a frequency divider 247a, a multiplexer 247b, an oscillator 247c, a counter 247d, a half period latch 247e, and a comparator 247f.

The frequency divider 247a divides the frequency of the data signal DIN to generate a period extension signal EDN2. In this embodiment, the frequency of the period extension signal EDN2 is half that of the data signal DIN. That is to say, the unit period of the period extension signal EDN2 is twice as that of the data signal DIN.

The multiplexer 247b selects one of the period extension signal EDN2 and the falling transition driving signal EN_F according to the mode signal XMOD. The selected one of the period extension signal EDN2 and the falling transition driving signal EN_R is output from the multiplexer as an enable signal XEN2. In this embodiment, the period extension signal EDN2 is selected when operating in the period confirming mode MTDG. The falling transition driving signal EN_F is selected when operating in the internal clock generating mode MGIC.

The oscillator 247c is enabled in response to the enable signal XEN2. In this embodiment, the oscillator 247c is enabled when the enable signal XEN2 is in a logic "H" state. The oscillator 247c generates an oscillation signal OSC2 when it is enabled.

The counter 247d is reset in response to the transition to "H" in the enable signal XEN2. The counter 247d counts the number of rising transitions to "H" in the oscillation signal OSC2 to generate a counting data signal CNT2.

The half period latch 247e is reset in response to the rising transition to "H" in the mode signal XMOD. The half period latch 247e divides the counting data CNT2 into halves to generate the period digital data TDIG. Here, the remaining data can be ignored.

Accordingly, the period digital data TDIG has the same period as the data signal DIN.

In the internal clock generating mode MGIC, the comparator 247f compares the counting data CNT2 with the period digital data TDIG to generate a falling half period signal XHT_F. The falling half period signal XHT_F undergoes a "L" pulse when the counting data CNT2 is equal to the period digital data TDIG.

As a result, the falling half period signal XHT_F undergoes a "L" pulse when the half period of the data signal DIN is passed following a lagging edge of the falling transition driving signal EN_F.

In this embodiment, the constitution of the falling-driving group 247 is the same as that of the rising-driving group 243. The period digital data in falling-driving group 247 is the same as that in the rising-driving group 243. Therefore, the period digital data in rising-driving group 243 and the period digital data in falling-driving group 247 are marked with the same reference mark TDIG, for the convenience of explanation, in this specification.

Referring again to FIG. 4, the clock transition generating unit 250 generates the clock transition signal XCKT in response to the rising transition responding signal PCTB_R, the rising half period signal XHT_R, the falling transition responding signal PCTB_F, and the falling half period signal XHT_F. In the embodiment shown in FIG. 4, the clock transition generating unit 250 is formed of three logic AND gates, the first AND gate receiving at its inputs the PCTB_R and XHT_R signals, the second AND gate receiving at its inputs the PCTB_F and XHT_F signals, and the third AND gate receiving at its inputs the outputs of the first and second AND gates and producing at its output the XCKT signal.

Here, the clock transition signal XCKT undergoes a "L" pulse when at least one of the rising transition responding signal PCTB_R, the rising half period signal XHT_R, the falling transition responding signal PCTB_F and the falling half period signal XHT_F undergo a "L" pulse (Refer to FIG. 10A).

Referring again to FIG. 1, the internal clock transition part 300 generates the internal clock signal ICLK in response to the clock transition signal XCKT. The logic state of the internal clock signal ICLK is alternatively transited between "H" and "L" at each falling transition (marking the beginning of a "L" pulse) in the clock transition signal XCKT.

Figure 10B:
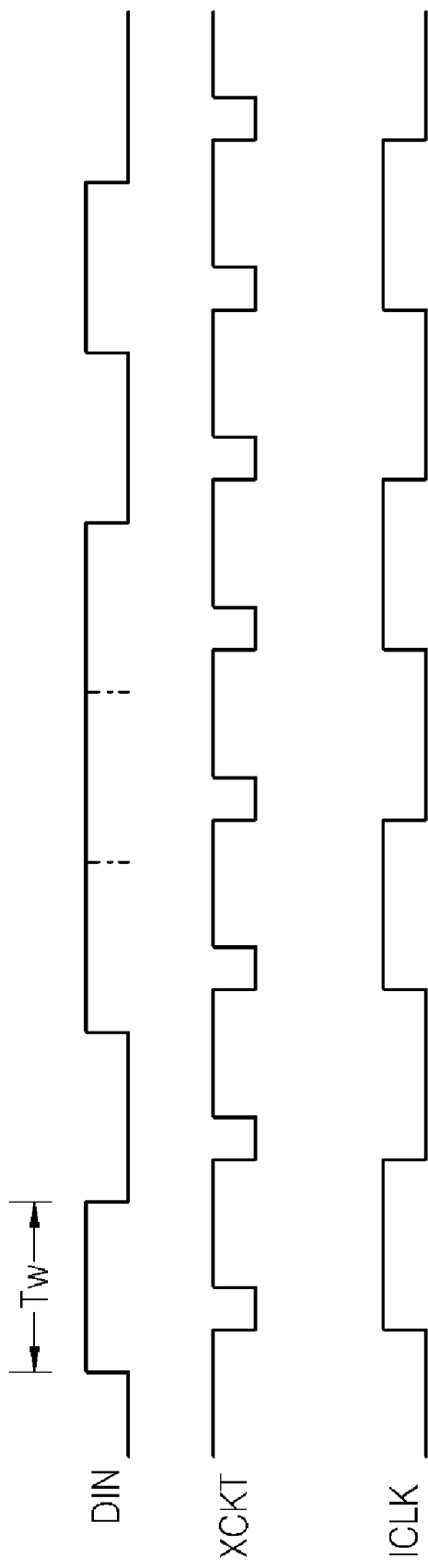

Accordingly, the internal clock signal ICLK transitions between logic states in response to transitions in the data signal. Also, even if transitions in the data signal are not generated for long time, the logic state of the internal clock signal ICLK alternates between "H" and "L" states every time the waiting time TW is elapsed following a transition in the data signal DIN (Refer to FIG. 10B).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An internal clock generating circuit for generating a clock signal using a data signal, the internal clock generating circuit comprising:
 a transition detecting block receiving the data signal at an input, detecting transitions in the data signal, and generating at least one data transition information signal indicative of the timing of the detected transitions in the data signal; and
 an internal clock generating block receiving the data transition information signal from the transition detecting block, generating a period digital data signal by detecting a unit period of the data signal when operating in a period confirming mode, and generating an internal clock signal in response to the data transition information signal when operating in an internal clock generating mode,
 wherein the internal clock signal transitions between logic states after a waiting time has elapsed following a transition in the data signal,
 wherein the waiting time is dependent on the period digital data signal, and
 wherein the waiting time is equal to half of the unit period of the data signal.

2. An internal clock generating circuit for generating a clock signal using a data signal, the internal clock generating circuit comprising:
 a transition detecting block receiving the data signal at an input, detecting transitions in the data signal, and generating at least one data transition information signal indicative of the timing of the detected transitions in the data signal; and
 an internal clock generating block receiving the data transition information signal from the transition detecting block, generating a period digital data signal by detecting a unit period of the data signal when operating in a period confirming mode, and generating an internal clock signal in response to the data transition information signal when operating in an internal clock generating mode,
 wherein the internal clock signal transitions between logic states after a waiting time has elapsed following a transition in the data signal,
 wherein the waiting time is dependent on the period digital data signal, and
 wherein the transition detecting block comprises:
 a rising transition confirmation portion generating a rising transition confirmation signal in response to rising transitions in the data signal, wherein the rising transition confirmation signal is a first data transition information signal; and
 a falling transition confirmation portion generating a falling transition confirmation signal in response to falling transitions in the data signal, wherein the falling transition confirmation signal is a second data transition information signal.

3. The circuit of claim 2, wherein the internal clock generating block comprises:
 an internal clock pulse generating part generating the period digital data when operating in the period confirming mode, and generating a clock transition signal according to the data transition information when operating in the internal clock generating mode, wherein the clock transition signal undergoes a LOW voltage pulse every time the waiting time elapses following a transition in the data signal; and
 an internal clock transition part generating the internal clock signal, wherein the internal clock signal transitions between logic states in response to each pulse in the clock transition signal.

4. The circuit of claim 3, wherein the internal clock pulse generating part comprises:
 a rising transition responding portion generating a rising transition responding signal in response to the rising transition confirmation signal, wherein the rising transition responding signal undergoes a LOW pulse in response to each rising edge transition in the rising transition confirmation signal;
 a falling transition responding portion generating a falling transition responding signal in response to the falling transition confirmation signal, wherein the falling transition responding signal undergoes a LOW pulse in response to each rising edge transition in the falling transition confirmation signal;
 a combining transition responding portion generating a reset signal in response to the rising transition responding signal and the falling transition responding signal; and
 an internal clock transition portion generating the period digital data when operating in the period confirming mode, and generating the clock transition signal in response to the rising transition responding signal and the falling transition responding signal when operating in the internal clock generating mode.

5. The circuit of claim 4, wherein the internal clock transition portion comprises:
 a half period transition unit generating the period digital data when operating in the period confirming mode, and generating a rising half period signal and a falling half period signal when operating in the internal clock generating mode, wherein the rising half period signal and the falling half period signal undergo LOW voltage pulses in response rising transitions in the rising transition responding signal and the falling transition responding signal, respectively, and wherein the generation of the pulse in the rising half period signal and the falling half period signal is stopped in response to the reset signal; and
 a clock transition generating unit generating the clock transition signal, wherein clock transition signal is responsive to the rising transition responding signal, the rising half period signal, the falling transition responding signal and the falling half period signal.

6. The circuit of claim 5, wherein the half period transition unit comprises:
 a rising detection group generating a rising transition driving signal, wherein the rising transition driving signal is activated in response to the rising transition responding signal or a falling transition driving signal and deactivated in response to the reset signal and the rising half period signal;
 a rising-driving group generating the rising half period signal, wherein the rising half period signal undergoes a pulse delayed by the waiting time following the activation of the rising transition driving signal, and wherein the generation of the pulse in the rising half period signal is interrupted in response to the deactivation of the rising transition driving signal;
 a falling detection group generating the falling transition driving signal, wherein the falling transition driving signal is activated in response to the falling transition responding signal or the rising transition driving signal and deactivated in response to the reset signal and the falling half period signal; and a falling-driving group generating the falling half period signal, wherein the falling half period signal undergoes a pulse delayed by the waiting time following the activation of the falling transition driving signal, and wherein the generation of the pulse in the falling half period signal is interrupted in response to the deactivation of the falling transition driving signal.

7. An internal clock generating method for generating a clock signal using a data signal, the internal clock generating method comprising:

generating a period digital data signal by detecting a unit period of a data signal when operating in a period confirming mode; and generating an internal clock signal when operating in an internal clock generating mode, wherein the internal clock signal transitions between logic states after a waiting time has elapsed following a transition in the data signal, wherein the waiting time is dependent on the period digital data signal, wherein the internal clock signal transitions between logic states after a waiting time has elapsed following a transition in the data signal.

8. The method of claim 7, wherein the waiting time is the half of the unit period of the data signal.

* * * * *